(12) United States Patent
Kitajima

(10) Patent No.: US 10,615,120 B2
(45) Date of Patent: Apr. 7, 2020

(54) SEMICONDUCTOR DEVICE INCLUDING A FUSE ELEMENT

(71) Applicant: ABLIC Inc., Chiba-shi, Chiba (JP)

(72) Inventor: Yuichiro Kitajima, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/937,200

(22) Filed: Mar. 27, 2018

(65) Prior Publication Data

US 2018/0286807 A1  Oct. 4, 2018

(30) Foreign Application Priority Data

Mar. 30, 2017 (JP) .................................. 2017-068170

(51) Int. Cl.
*H01L 23/525* (2006.01)

(52) U.S. Cl.
CPC .............................. *H01L 23/5258* (2013.01)

(58) Field of Classification Search
CPC .................................................. H01L 23/5258
USPC ........................................................ 257/529
See application file for complete search history.

(56) References Cited

U.S. PATENT DOCUMENTS

| | | | |
|---|---|---|---|
| 5,949,323 A | 9/1999 | Huggins et al. | |
| 6,225,652 B1 * | 5/2001 | Devanney | H01L 23/5258 257/209 |
| 6,258,700 B1 * | 7/2001 | Bohr | H01L 23/5256 257/E23.149 |
| 7,211,843 B2 * | 5/2007 | Low | H01L 23/5256 257/173 |
| 8,105,886 B2 * | 1/2012 | Otsuka | H01L 23/5256 438/132 |
| 2003/0052385 A1 * | 3/2003 | Mori | H01L 23/5258 257/529 |
| 2007/0222027 A1 * | 9/2007 | Yang | H01L 23/5256 257/529 |
| 2008/0185678 A1 * | 8/2008 | Kitajima | H01L 28/20 257/529 |
| 2014/0131764 A1 * | 5/2014 | Chung | H01L 29/6609 257/119 |
| 2018/0286807 A1 * | 10/2018 | Kitajima | H01L 23/5258 |

FOREIGN PATENT DOCUMENTS

| | | |
|---|---|---|
| JP | 2000-030587 A | 1/2000 |
| JP | 2015-185583 A | 10/2015 |
| JP | 2015185583 A * | 10/2015 |

* cited by examiner

*Primary Examiner* — Mohammad M Hoque
(74) *Attorney, Agent, or Firm* — Brinks Gilson & Lione

(57) ABSTRACT

Provided is a semiconductor device including a fuse element arranged on an interlayer insulating film formed on a semiconductor substrate. The fuse element is formed of polysilicon and a silicide region arranged on an upper surface of the polysilicon. A region of the polysilicon included in a range to be irradiated with a laser beam in plan view is non-doped polysilicon into which impurities are not introduced. With this structure, it is possible to provide the semiconductor device including the fuse element, which can be stably cut with a laser beam while an underlying film is not damaged.

13 Claims, 7 Drawing Sheets

SEMICONDUCTOR DEVICE INCLUDING A FUSE ELEMENT

RELATED APPLICATIONS

This application claims priority under 35 U.S.C. § 119 to Japanese Patent Application No. 2017-068170 filed on Mar. 30, 2017, the entire content of which is hereby incorporated by reference.

BACKGROUND OF THE INVENTION

1. Field of the Invention

The present invention relates to a semiconductor device. In particular, the present invention relates to a semiconductor device including a fuse element configured to change the circuit configuration by cutting.

2. Description of the Related Art

There is a method of changing a circuit configuration by cutting a fuse element made of, for example, polysilicon or metal with, for example, a laser beam after a wafer manufacturing process in a manufacturing process of a semiconductor device. Through use of the method, desired characteristics can be obtained by correcting a resistance value after measurement of the electrical characteristics of the semiconductor device. The method is particularly effective for the semiconductor device in which analog characteristics are important.

In this method, the fuse element is required to have stability on cutting with a laser beam.

In Japanese Patent Application Laid-open No. 2000-30587, there is proposed a method of stably cutting a fuse element by forming a laser irradiation portion of the fuse element into a circular shape so as to efficiently utilize laser energy for fusing.

First, a sectional structure of a related-art fuse element that is generally used is described. FIG. 7 is a schematic view for illustrating a sectional structure of the fuse element, and is a sectional view taken along a width direction of the fuse element, which corresponds to a direction perpendicular to a current flowing in the fuse element. The first interlayer insulating film 21 is arranged on a semiconductor substrate 11, for example, a silicon substrate, and a polysilicon 12 is formed thereon. The polysilicon 12 corresponds to the fuse element. A second interlayer insulating film 22 is formed so as to cover the polysilicon 12. The final protection film 23 is formed on the second interlayer insulating film 22. The final protection film 23 has a protection-film opening region 32 in which the protection film 23 is removed above the region in which the fuse element is formed. Only the second interlayer insulating film 22 covers the polysilicon 12 serving as the fuse element from above. A laser spot region 31 to which the laser beam is irradiated for cutting the fuse element, completely covers, in the width direction of the fuse element, the region in which the polysilicon 12 forming the fuse element is cut.

Next, with respect to cutting of the fuse element with the laser beam, the principle of the cutting is described. When the fuse element is irradiated with the laser beam, the fuse element irradiated with the laser beam absorbs heat to melt and evaporate. The second interlayer insulating film 22, which is arranged above the fuse element, is hence blown off by the internal pressure generated by the evaporation and the volume expansion of the fuse element. At this time, when an internal pressure of the polysilicon 12 increases, not only the portion above the polysilicon 12 but also side surfaces and a bottom surface corresponding to the first interlayer insulating film 21 are pressurized. When the portion above the polysilicon 12 of the fuse element is released, the polysilicon 12 of the fuse element evaporates to diffuse outward. Then, the polysilicon 12 of the fuse element is brought into a state after cutting.

An influence of damage to the periphery of the fuse element can be taken as a physical characteristic of the fuse element that is cut with a laser beam in such a manner. The fuse element expands in volume by applying the heat with a laser beam so that the film physically breaks. Thus, the influence of the damage to the first interlayer insulating film 21, which is in contact with the bottom surface of the polysilicon 12 serving as the fuse element, and hence there is a risk of generating a crack. When a crack is formed in the first interlayer film 21, the evaporated polysilicon 12 intrudes into and adheres to the crack. In this manner, the fuse element may be electrically short-circuited with the semiconductor substrate 11.

In order to prevent the formation of such a crack, measures such as thinning of the interlayer insulating film arranged above the fuse element and reduction in energy of a laser beam are conceivable. However, in the manufacturing process, it is difficult to control the film thickness of the interlayer insulating film arranged above the fuse element, and may be burdensome in the process. Further, when energy of a laser beam is reduced, the polysilicon 12 incompletely evaporates due to energy shortage, thereby causing incomplete cutting of the fuse element.

As described above, in a fuse element of a laser-blow type in which the polysilicon is used, a trade-off relationship is established between the damage to the peripheral portion around the fuse element and the risk of incomplete cutting of the fuse element. In particular, in a case in which the laser irradiation portion has a circular shape, as described in Japanese Patent Application Laid-open No. 2000-30587, a pressure in a vertical direction in cross section increases, and hence the interlayer insulating film arranged above the fuse element is easily blown off. At the same time, a pressure to the interlayer insulating film arranged below the fuse element increases, and hence the crack is liable to be formed.

SUMMARY OF THE INVENTION

The present invention has been made in view of the above-mentioned situation, and it is an object of the present invention to provide a semiconductor device including a fuse element in which a risk of incomplete cutting of the fuse element is small, and damage to a periphery around the fuse element is not liable to occur in cutting with a laser beam.

In order to achieve the above-mentioned object, according to one embodiment of the present invention, the following structure is adopted.

Specifically, there is provided a semiconductor device including: a semiconductor substrate; and a fuse element arranged on an interlayer insulating film formed on the semiconductor substrate, the fuse element being formed of polysilicon and silicide region arranged on an upper surface of the polysilicon, the polysilicon having a region included in a range to be irradiated with a laser beam in plan view, and being formed of non-doped polysilicon into which impurities are not introduced.

According to the present invention, the region of the fuse element to be irradiated with a laser beam is formed of the non-doped polysilicon whose upper surface is silicided and into which impurities are not introduced. Further, a long wavelength can be adopted as the wavelength of the radiated laser beam, and hence only the silicided upper surface portion can easily absorb the laser beam while the non-doped polysilicon portion does not absorb the laser beam. Only the silicided upper surface portion is thereby heated during the laser irradiation to be cut. Further, it is possible to provide the fuse element in which the non-doped polysilicon portion functions as a protection, thereby being possible to cut while the underlying film is not damaged.

DETAILED DESCRIPTION OF THE EMBODIMENTS

Now, embodiments of the present invention are described with reference to the drawings.

Figure 1:
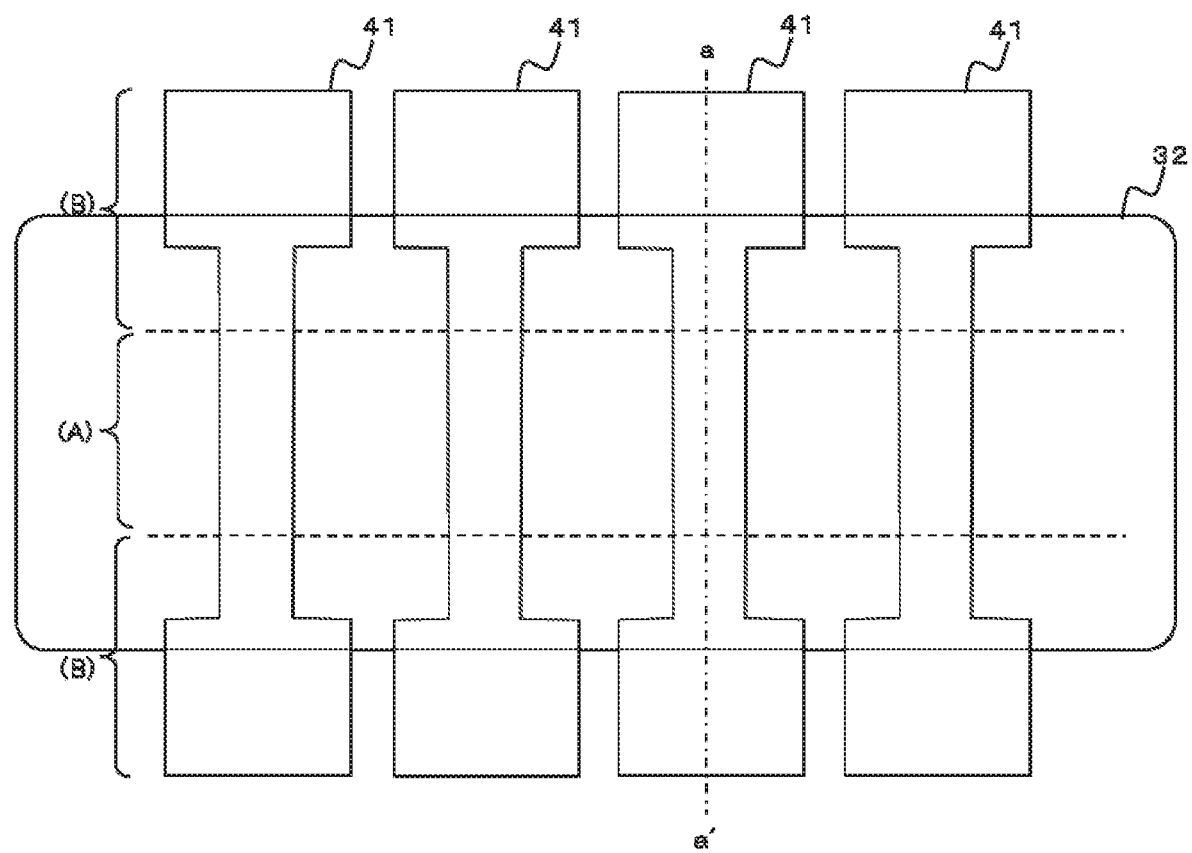
FIG. 1 is a plan view for illustrating a semiconductor device according to the present invention.

FIG. 1 is a plan view for illustrating a semiconductor device according to a first embodiment of the present invention. Fuse elements 41 are provided, and a protection-film opening region 32 is arranged so as to cover a part of regions of the fuse elements 41. The fuse elements 41 each have two regions. The region (A) illustrated in FIG. 1 is a region to be irradiated with a laser beam, and the region (B) is a region not to be irradiated with a laser beam. In FIG. 1, a shape of the fuse element 41 in plan view is a dumbbell shape. However, the shape of the fuse element 41 is not limited to the dumbbell shape.

Figure 2:
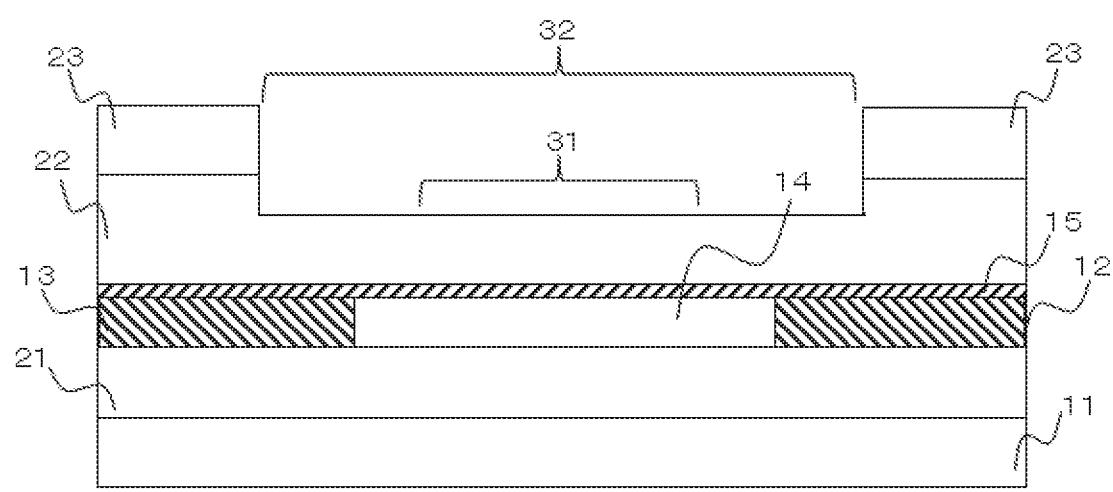
FIG. 2 is a sectional view for illustrating the semiconductor device according to the present invention.

FIG. 2 is a sectional view taken along the dashed-dotted line a-a' of FIG. 1. With reference to FIG. 2, the sectional structure is described in detail. First, a first interlayer insulating film 21 is formed on a semiconductor substrate 11. A layer serving as a fuse element is formed on the first interlayer insulating film 21. The layer serving as a fuse element is formed of three regions. The three regions include a region that is formed of a non-doped polysilicon 14 and is larger than a laser spot region 31 in plan view, and regions that are formed of a doped polysilicon 13 and are arranged adjacently to both the ends of the non-doped polysilicon 14. The doped polysilicon 13 and the non-doped polysilicon 14 are formed of a polysilicon 12. The doped polysilicon 13 is a polysilicon that has conductivity through introduction of impurities into a non-doped polysilicon by, for example, an ion implantation method. In some cases, an upper surface of the doped polysilicon 13 is amorphized by the ion implantation of the impurities. However, from a viewpoint that the upper surface of the doped polysilicon 13 can be reduced in resistance when the polysilicon is amorphized in the subsequent silicide formation, the upper surface of the doped polysilicon 13 may be left as amorphous silicon.

Further, on the both upper surfaces of the doped polysilicon 13 and the non-doped polysilicon 14, a silicide region 15 is formed. A second interlayer insulating film 22 is formed to be arranged on the fuse element having the structure described above. Moreover, a final protection film 23 is formed at a part of a region on the second interlayer insulating film 22.

As illustrated in FIG. 2, the final protection film 23 has the protection-film opening region 32 in which the protection film 23 is removed, and includes the laser spot region 31 above the fuse element. Further, a region of the second interlayer insulating film 22, in which the protection-film opening region 32 is formed, has a film thickness smaller than that of a region of the second interlayer insulating film 22 except for the protection-film opening region 32. This is because, as described in the principle of the cutting, the second interlayer insulating film 22 is required to be thinned to some extent so as to have a thickness suitable for the laser cutting in order to facilitate the cutting of the fuse with a laser beam. Also, the final protection film 23 has the protection-film opening 32 because the absorption of the laser beam by the final protection film 23 is prevented not to hinder the laser beam irradiation to the fuse element.

Next, the cutting with a laser beam is described. When the laser spot region 31 illustrated in FIG. 2 is irradiated with the laser beam, the silicide region 15, which absorbs the laser energy, melts and evaporates. At this time, it is effective that, as a wavelength of a laser beam, a wavelength that is less absorbed by silicon, and is easily absorbed by silicide region 15 being a compound of metal and silicon is selected. For example, the wavelength of the laser beam may be set to 1.3 µm. Use of a long wavelength is an effective measure for the prevention of the damage in view of possible prevention of heat generation in the semiconductor substrate 11, for example, a silicon substrate.

Further, the region of the fuse element to be irradiated with a laser beam is set to the silicide region 15 on the non-doped polysilicon 14. If the doped polysilicon 13 were included in the region to be irradiated with a laser beam, since the doped polysilicon 13 exhibits a laser absorption property close to that of metal, the present embodiment would be similar to the related-art method, and a problem would arise that an underlying film is damaged due to the melting and evaporation of the doped polysilicon 13. Thus, the laser spot region 31 and the regions of the doped polysilicon 13 are required to be designed so as to have sufficient margin in consideration of a processing variation during manufacturing and a laser alignment accuracy so as not to overlap with each other. In plan view of FIG. 1, the region of the non-doped polysilicon 14 completely includes the region (A), which is to be irradiated with a laser beam, and boundaries between the non-doped polysilicon 14 and the doped polysilicon 13 are included in the region (B), which is not to be irradiated with a laser beam.

In the first embodiment, one of the features is that the laser energy is effectively absorbed by the silicide region 15, and is not absorbed by the non-doped polysilicon 14. The cutting with a laser beam is performed by melting and evaporating the silicide region 15, and the non-doped polysilicon 14 functions as a protection layer for alleviating the damage to the first interlayer insulating film 21 being an underlying film.

Figure 3:
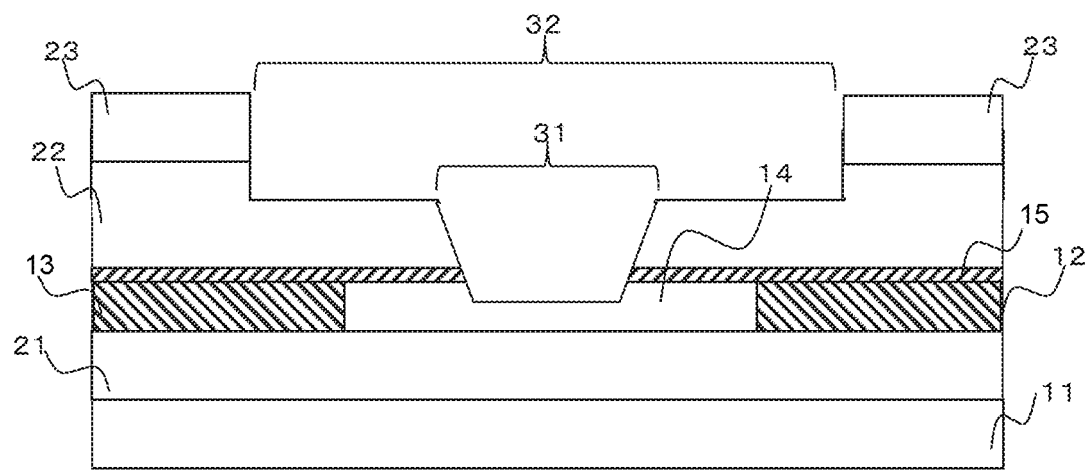
FIG. 3 is a sectional view for illustrating the semiconductor device according to the present invention.

FIG. 3 is a sectional view for illustrating a state in which the fuse element is cut with a laser beam, which corresponds to FIG. 2. As illustrated in FIG. 3, after the laser irradiation, the silicide 15 melts and evaporates, and the second interlayer insulating film 22 arranged on the silicide region 15 is removed. A part of the non-doped polysilicon 14 also melts and evaporates by heat of the silicide region 15. In the present invention, the non-doped polysilicon 14 functions as the protection layer, and hence the damage can be suppressed, with the result that the laser energy can be increased. Further, in view of the protection of the underlying film, the non-doped polysilicon 14 should have a film thickness larger than that of the silicide region 15. With this structure, by virtue of the increased energy, it is possible to reduce the risk of the incomplete cutting of the fuse element.

In the state of FIG. 3, the silicide region 15 is cut, and the non-doped polysilicon 14 is partially connected. However, current does not flow because conductive impurities are not introduced into the non-doped polysilicon 14, and hence the fuse element is brought into the same state as the state of complete cutting.

In the first embodiment, the region of the fuse element to be irradiated with a laser beam is formed of the non-doped polysilicon whose upper surface is silicided and into which impurities are not introduced. The region of the fuse element to be irradiated with a laser beam has the structure in which the non-doped polysilicon portion does not absorb the laser beam, and only the silicided upper surface portion easily absorbs the laser beam. With this structure, only the silicided upper surface portion is heated during the laser irradiation to be cut. Thus, the non-doped polysilicon portion functions as a protection, and hence it is possible to provide the fuse element in which cutting can be made without damage to the underlying film. Through setting of the wavelength of the radiated laser beam to the long wavelength, the effect can further be increased.

Next, a second embodiment of the present invention is described.

Figure 4:
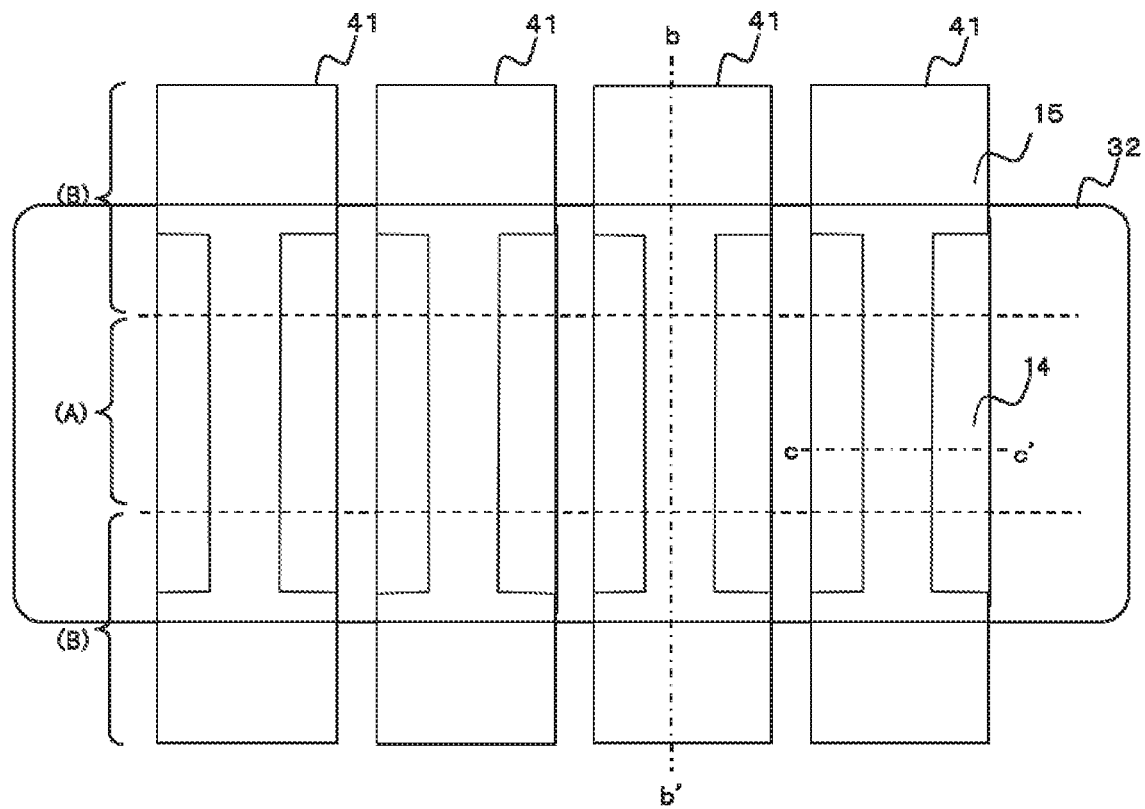
FIG. 4 is a plan view for illustrating the semiconductor device according to the present invention.

FIG. 4 is a plan view for illustrating a semiconductor device according to the second embodiment of the present invention. Fuse elements 41 are provided, and a protection-film opening region 32 is arranged so as to cover a part of regions of the fuse elements 41. The fuse elements 41 each have two regions. The region (A) illustrated in FIG. 4 is a region to be irradiated with a laser beam, and the region (B) is a region not to be irradiated with a laser beam. Further, the fuse element 41 is formed of two regions, which are a region of a silicide region 15 and a region that is not silicided in plan view. In the fuse element, the region that is not the silicide region 15 in the region (A), which is to be irradiated with a laser beam, corresponds to a non-doped polysilicon 14. In FIG. 4, the region of the silicide region 15 has a dumbbell shape in plan view, and the fuse element 41 has a rectangular shape in plan view. However, the shapes of the silicide region 15 and the fuse element 41 in plan view are not limited to the dumbbell shape and the rectangular shape, respectively.

Figure 5:
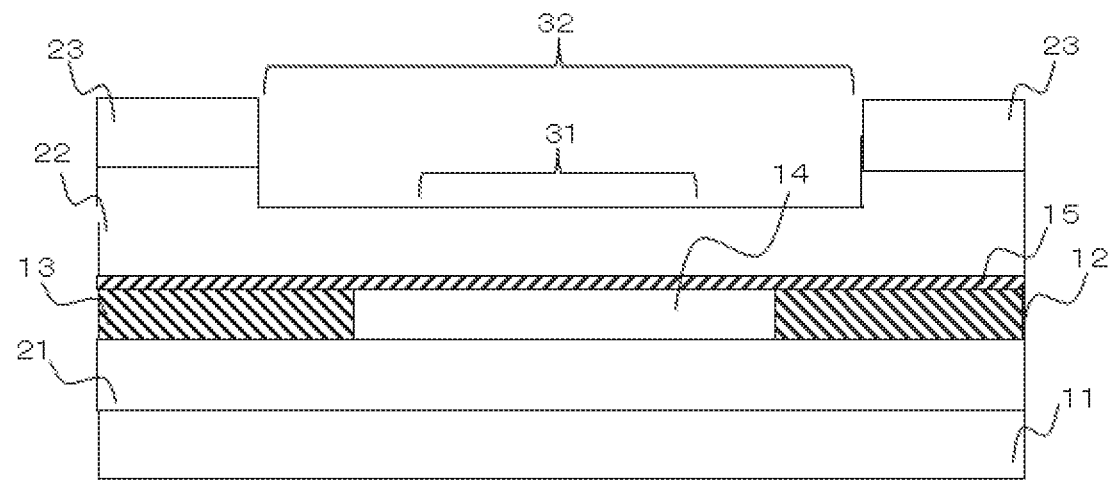
FIG. 5 is a sectional view for illustrating the semiconductor device according to the present invention.

FIG. 5 is a sectional view taken along the dashed-dotted line b-b' of FIG. 4. With reference to FIG. 5, the sectional structure is described in detail. A first interlayer insulating film 21 is formed on a semiconductor substrate 11. A layer serving as a fuse element is formed on the first interlayer insulating film 21. The layer serving as a fuse element is formed of three regions. The three regions include a region that is formed of the non-doped polysilicon 14 and is larger than a laser spot region 31 in plan view, and regions that are formed of a doped polysilicon 13 and are arranged at both the ends of the non-doped polysilicon 14. The doped polysilicon 13 and the non-doped polysilicon 14 are formed of a polysilicon 12. The doped polysilicon 13 is polysilicon that has conductivity through introduction of impurities into a non-doped polysilicon by, for example, an ion implantation method. In some cases, an upper surface of the doped polysilicon 13 is amorphized by the ion implantation of the impurities. However, from a viewpoint that the upper surface of the doped polysilicon 13 can be reduced in resistance when the polysilicon is amorphized in silicide formation, the upper surface of the doped polysilicon 13 may be left as amorphous silicon.

Further, on the both upper surfaces of the doped polysilicon 13 and the non-doped polysilicon 14, the silicide region 15 is formed. A second interlayer insulating film 22 is formed on the fuse element formed of the above-mentioned components. Moreover, a final protection film 23 is formed at a part of a region.

As illustrated in FIG. 5, the final protection film 23 has the protection-film opening region 32 in which the protection film 23 is removed, and includes the laser spot region 31 above the fuse element. Further, a region of the second interlayer insulating film 22, in which the protection-film opening region 32 is formed, has a film thickness smaller than that of a region of the second interlayer insulating film 22 except for the protection-film opening region 32. This is because, as described in the principle of the cutting, the second interlayer insulating film 22 is required to be thinned to some extent in order to facilitate the cutting of the fuse with a laser beam. Meanwhile, the final protection film 23 is opened because the laser beam is prevented from being absorbed by the final protection film 23 not to hinder the irradiation to the fuse element with the laser beam.

Figure 6:
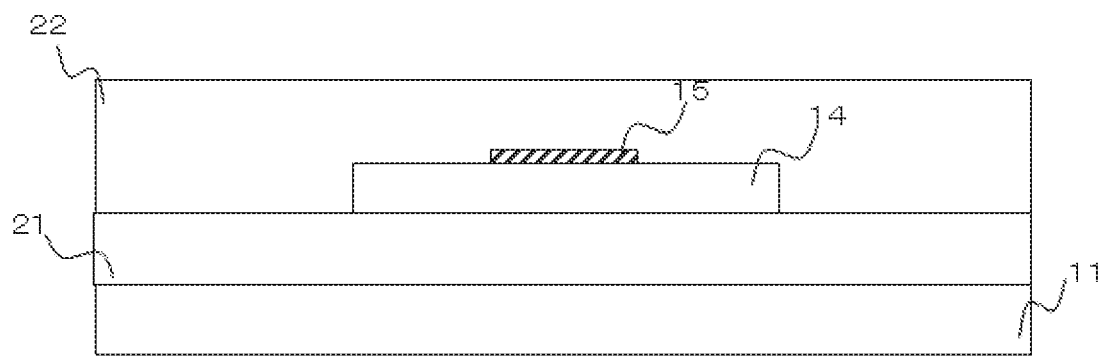
FIG. 6 is a sectional view for illustrating the semiconductor device according to the present invention.
Figure 7:
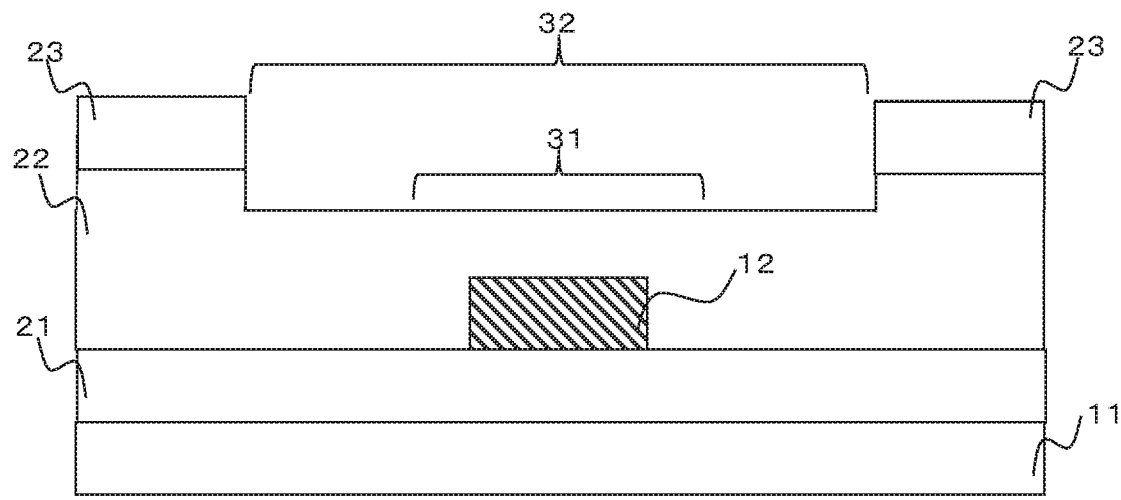
FIG. 7 is a sectional view for illustrating a related-art semiconductor device.

FIG. 6 is a sectional view taken along the dashed-dotted line c-c' of FIG. 4. With reference to FIG. 6, the sectional structure is described in detail. In the second embodiment, the region of the fuse element to be irradiated with a laser beam is formed of, as described above, the silicide region 15 and the non-doped polysilicon 14. As illustrated in FIG. 6, the silicide region 15 is formed on a part of the region including the center of the non-doped polysilicon 14. The silicide region 15 corresponds to a portion cut with a laser beam.

The region of the fuse element to be irradiated with a laser beam is set to a region on the non-doped polysilicon 14. If the doped polysilicon 13 were included in the region to be irradiated with a laser beam, since the doped polysilicon 13 exhibits a laser absorption property close to that of metal, the present embodiment would be similar to the related-art method and a problem would arise that an underlying film is damaged due to the melting and evaporation of the doped polysilicon 13. Thus, the laser spot region 31 and the regions of the doped polysilicon 13 are required to be designed so as to have sufficient margin in consideration of a processing variation during manufacturing and a laser alignment accuracy so as not to overlap with each other. In plan view of FIG. 4, the region of the non-doped polysilicon 14 completely includes the region (A), which is to be irradiated with a laser beam, and boundaries between the non-doped polysilicon 14 and the doped polysilicon 13 are included in the region (B), which is not to be irradiated with a laser beam.

The cutting with a laser beam is performed by the same method as that in the first embodiment.

In the second embodiment, one of the features is that the laser energy is effectively absorbed by the silicide region 15, and is not absorbed by the non-doped polysilicon 14. With this configuration, the cutting with a laser beam is performed by melting and evaporating the silicide region 15, and the non-doped polysilicon 14 functions as a protection layer for alleviating the damage to the first interlayer insulating film 21 being an underlying film. After the laser irradiation, the silicide region 15 melts and evaporates, and the second interlayer insulating film 22 arranged above the silicide region 15 is removed.

The non-doped polysilicon 14 partially melts and evaporates due to heat of the silicide region 15. However, in the second embodiment, the non-doped polysilicon 14 functions as the protection layer, and hence the damage can be suppressed, with the result that the laser energy can be increased. In view of the protection of the underlying film, the non-doped polysilicon 14 should have a film thickness larger than that of the silicide region 15.

In the second embodiment, as illustrated in FIG. 6, the non-doped polysilicon 14 serving as the protection layer is larger than the silicide region 15, and hence a protection property against the damage to the underlying film is higher in plan view. Thus, by virtue of the increased energy, it is possible to reduce the risk of incomplete cutting of the fuse element.

The region of the silicide region 15 to be irradiated with a laser beam is cut through melting and evaporation. A part of the non-doped polysilicon 14 is still connected, but conductive impurities are not introduced into the non-doped polysilicon 14, and hence the fuse element is brought into a state of complete cutting.

As described above, the non-doped polysilicon, in which the upper surface of the region to be irradiated with a laser beam is silicided, and into which impurities are not introduced, is adopted as the fuse element. As the radiated laser beam, the long wavelength is adopted. In this manner, the polysilicon portion is non-doped, and thus does not absorb a laser beam, with the result that only the silicided upper surface portion can easily absorb the laser beam. With this structure, only the upper surface portion that is silicided is heated during the laser irradiation to be cut. In this manner, it is possible to provide a fuse element in which the non-doped polysilicon portion functions as a protection and in which cutting can be made without damage to the underlying film.

What is claimed is:

1. A semiconductor device, comprising:
a semiconductor substrate;
an interlayer insulating film in contact with an upper surface of the semiconductor substrate; and
a fuse element having an entire lower surface in contact with an upper surface of the interlayer insulating film,
the fuse element comprising a polysilicon layer and a silicide layer extending across an upper surface of the polysilicon layer from a first end to a second end thereof,
the polysilicon layer and the silicide layer having an irradiation range in plan view that is configured to receive a laser beam irradiation, the irradiation range comprising a non-doped polysilicon region of the polysilicon layer that is devoid of impurities and an overlying portion of the silicide layer,
wherein the silicide layer in the irradiation range selectively absorbs radiation relative to the non-doped polysilicon region in the irradiation range.

2. The semiconductor device according to claim 1, wherein the fuse element, includes a doped polysilicon region in the polysilicon layer, adjacent to the non-doped polysilicon region, and the doped polysilicon region includes impurities therein.

3. The semiconductor device according to claim 1, wherein the silicide layer in the irradiation range is such that, upon irradiation by the laser beam, an overlying portion of the silicide layer has a gap therein in which the upper surface of the non-doped polysilicon region is exposed.

4. The semiconductor device according to claim 1, wherein, in the irradiation range, the non-doped polysilicon region is larger than the overlying portion of the silicide layer in plan view.

5. The semiconductor device according to claim 1, wherein the non-doped polysilicon region has a greater film thickness than the overlying portion of the silicide layer.

6. The semiconductor device according to claim 2, wherein the overlying portion of the silicide layer is such that, upon irradiation by the laser beam the overlying portion of the silicide layer has a gap therein in which the upper surface of the non-doped polysilicon region is exposed.

7. The semiconductor device according to claim 2, wherein, in the irradiation range, the non-doped polysilicon region is larger than the overlying portion of the silicide layer in plan view.

8. The semiconductor device according to claim 2, wherein the non-doped polysilicon region has a greater film thickness than the silicide layer.

9. The semiconductor device according to claim 3, wherein, in the irradiation range, the non-doped polysilicon region is larger than the overlying portion of the silicide layer in plan view.

10. The semiconductor device according to claim 3, wherein the non-doped polysilicon region has a greater film thickness than the overlying portion of the silicide layer.

11. The semiconductor device according to claim 4, wherein the non-doped polysilicon region has a greater film thickness than the overlying portion of the silicide layer.

12. A semiconductor device, comprising:
a semiconductor substrate;
an interlayer insulating film in contact with an upper surface of the semiconductor substrate; and
a fuse element having an entire lower surface in contact with an upper surface of the interlayer insulating film,
the fuse element including:
a non-doped polysilicon region devoid of impurities;
doped polysilicon regions at opposite ends of the non-doped polysilicon region; and
a silicide layer having a first portion on an upper surface of the non-doped polysilicon region and a second portion on upper surfaces of the doped polysilicon regions,
wherein the silicide layer is such that, upon irradiation by a laser beam, the first portion of the silicide region has a gap therein in which an upper surface of the non-doped polysilicon region is exposed,
wherein the silicide layer selectively absorbs radiation relative to the non-doped polysilicon region.

13. The semiconductor device of claim 1, wherein the silicide layer in the irradiation range selectively absorbs laser radiation having a wavelength of 1.3 microns.

* * * * *